(12) United States Patent
Flores-Verdad et al.

(10) Patent No.: US 8,035,448 B1
(45) Date of Patent: Oct. 11, 2011

(54) DIFFERENTIAL AMPLIFIER THAT COMPENSATES FOR PROCESS VARIATIONS

(75) Inventors: Guillermo Espinosa Flores-Verdad, Puebla (MX); Arturo S. Scotto Guzman, Celaya (MX)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/832,295

(22) Filed: Jul. 8, 2010

(51) Int. Cl.
H03F 3/45 (2006.01)
(52) U.S. Cl. .......................... 330/255; 330/253
(58) Field of Classification Search .................. 330/253, 330/255, 257
See application file for complete search history.

(56) References Cited

U.S. PATENT DOCUMENTS

| | | | |
|---|---|---|---|
| 6,316,998 B1 * | 11/2001 | Oikawa | 330/255 |
| 6,628,168 B2 | 9/2003 | Martin et al. | |
| 6,822,513 B1 | 11/2004 | Li et al. | |
| 6,828,855 B1 | 12/2004 | Wang | |
| 7,193,464 B2 | 3/2007 | Wang et al. | |
| 7,236,055 B2 | 6/2007 | Halbert et al. | |
| 7,248,115 B2 * | 7/2007 | Nishimura | 330/253 |
| 7,265,615 B2 | 9/2007 | Alexander et al. | |
| 7,268,624 B2 | 9/2007 | Chen et al. | |
| 2008/0143439 A1 | 6/2008 | Tanimoto et al. | |

OTHER PUBLICATIONS

Sakurai, S., et al., Robust Design of Rail to Rail CMOS Operational Amplifier for a Low Power Supply Voltage, IEEE Journal of Solid-State Circuits, vol. 31, No. 2, Feb. 1996.

Setty, S, et al., CMOS +1V to –1V, Rail to Rail Operational Amplifier, IEEE. Savoy Place London WCPR OBL. UK, 1994.

Hwang, C., et al., A New Implementation of Constant-gm Op Amp Input Stage for CMOS Low Voltage Applications, IEEE, 0-7803,2972-4, 1996.

Bardyn, J. et al., Fully Differential Operational Amplifier Using CMOS Compatible Lateral Bipolar Transistors with Improved Common-Mode Regulation, Electronic Letters, vol. 26, No. 12, Jun. 7, 1990.

Lin, C.,et al., A Low-Voltage Low-Power CMOS OpAmp with Rail-to-Rail Input /Output, IEEE Fellow Department of Electrical Engineering , The Ohio State University, Columbus, OH 43210, USA, 1997.

Akikdo balced Schematic (8MB); Retrieved from internet on Mar. 9, 2010 URL: http://www.tubecad.com/2008/03/01/aikido%20balanced%20schematic.png.

* cited by examiner

Primary Examiner — Khanh Nguyen
(74) Attorney, Agent, or Firm — Ingrassia Fisher & Lorenz, PC (57) ABSTRACT

A fully differential amplifier includes an input stage and an output stage. The input stage has two differential pairs of n-type input transistors, and two differential pairs of p-type input transistors. The output stage has a first p-type output transistor and a second n-type output transistor, the first p-type output transistor having its source coupled to a first reference voltage node and having its drain coupled to a first output node for a first component of a differential output signal, and the second n-type output transistor having its drain coupled to the first output node and having its source coupled to a second reference voltage node. A p-type input transistor and an n-type input transistor influence operation of the first p-type output transistor such that current conducted by the p-type input transistor and current conducted by the n-type input transistor contribute to the output current conducted by the first p-type output transistor. Similarly, the output current conducted by the second n-type output transistor is influenced by one p-type input transistor and one n-type input transistor.

20 Claims, 2 Drawing Sheets

DIFFERENTIAL AMPLIFIER THAT COMPENSATES FOR PROCESS VARIATIONS

TECHNICAL FIELD

Embodiments of the subject matter described herein relate generally to electronic circuits. More particularly, embodiments of the subject matter relate to a differential amplifier.

BACKGROUND

Transistors are the core building block of the vast majority of semiconductor devices and electronic circuits. Semiconductor devices, such as processor devices, memory devices, and data communication devices, can include millions of transistors. Such devices utilize various electronic circuits and transistor topologies to support their operation. For example, many electronic devices employ transistor-based differential amplifiers. Generally, a differential amplifier receives a differential input signal and generates a corresponding differential output signal. A differential operational transconductance amplifier (OTA) is an amplifier that generates output current in response to a differential input voltage.

The prior art includes several fully differential OTA topologies, some of which address the issues of input/output dynamic range, constant transconductance ($g_m$), and other operational aspects. Conventional differential amplifier topologies, however, remain sensitive to transistor mismatches, manufacturing processes, and/or process-voltage-temperature (PVT) variations. Consequently, conventional differential OTA circuits are susceptible to performance degradation caused by transistor mismatches and process variations.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

In addition, certain terminology may also be used in the following description for the purpose of reference only, and thus are not intended to be limiting. For example, the terms "first," "second," and other such numerical terms do not imply a sequence or order unless clearly indicated by the context. Such terminology may include the words specifically mentioned above, derivatives thereof, and words of similar import.

Figure 1:
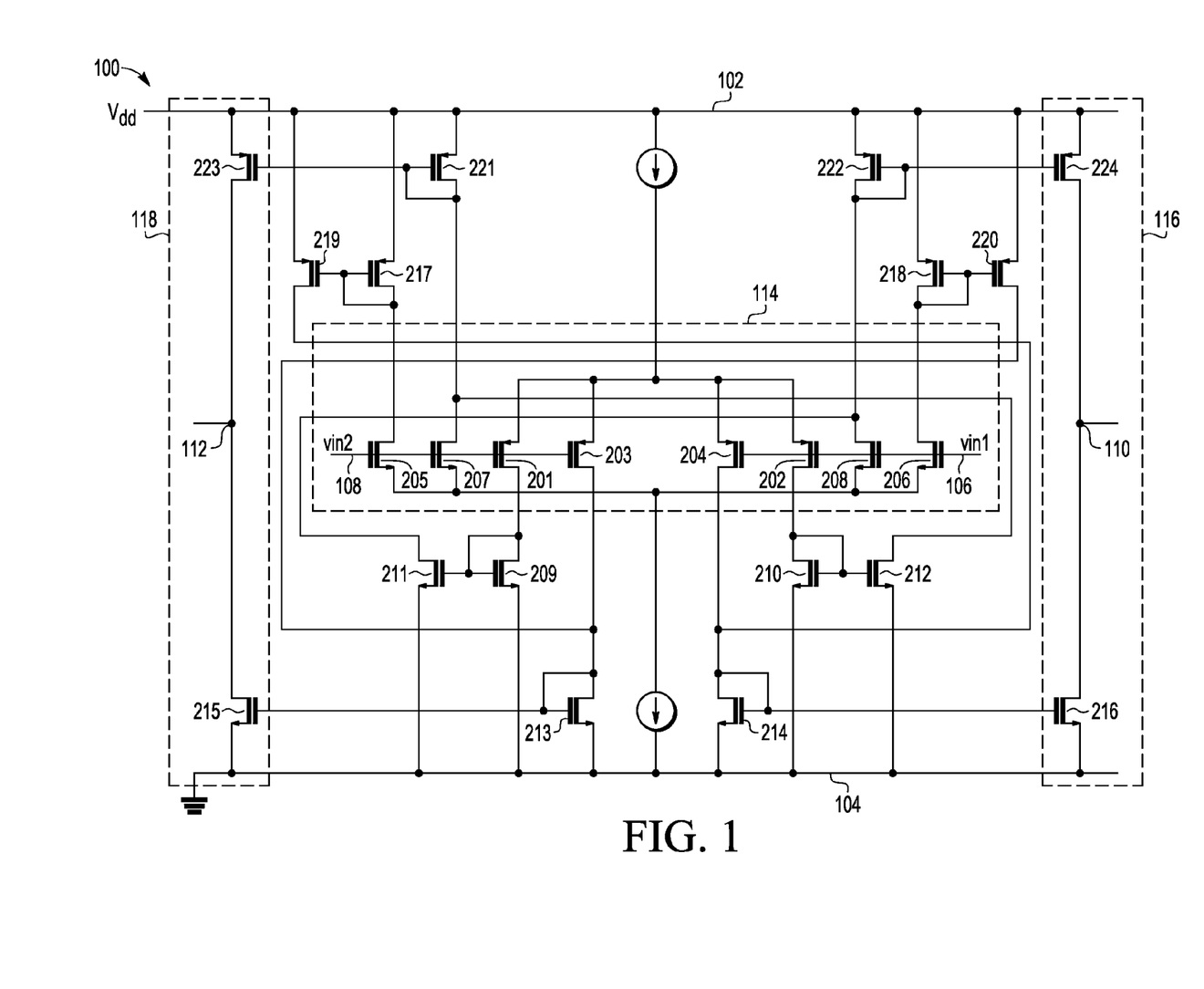
FIG. 1 is a circuit schematic of a differential amplifier configured in accordance with one exemplary embodiment of the invention.

FIG. 1 is a circuit schematic of an exemplary embodiment of a differential amplifier 100. Although the schematic shown in FIG. 1 depicts one exemplary arrangement of elements that are directly connected together, additional intervening elements, devices, features, or components may be present in an embodiment of the depicted subject matter. In this regard, the following description may refer to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

This particular embodiment of the differential amplifier 100 is implemented with field effect transistors, namely, metal oxide semiconductor field effect transistors (MOSFETs). More specifically, the differential amplifier 100 uses a plurality of MOSFETs having a first conductivity type (e.g., n-type) and a plurality of MOSFETs having a second conductivity type (e.g., p-type), arranged in the topology depicted in FIG. 1. It should be appreciated that an alternate embodiment could switch the conductivity type of the transistors in the differential amplifier 100. The differential amplifier 100 includes: a first reference voltage node 102; a second reference voltage node 104; a first input node 106; a second input node 108; a first output node 110; and a second output node 112. The first reference voltage node 102 may correspond to a supply voltage node, and the second reference voltage node 104 may correspond to a ground voltage node. Accordingly, a supply voltage (such as Vdd) can be established or otherwise maintained across the first reference voltage node 102 and the second reference voltage node 104. The first input node 106 receives the first component of a differential input signal, and the second input node 108 receives the second component of the differential input signal. The first output node 110 provides a first output of the differential amplifier 100, and the second output node 112 provides a second output of the differential amplifier 100. The first and second outputs may be considered to be the first and second components, respectively, of a differential output signal produced by the differential amplifier 100. The voltages present at the first output node 110 and the second output node 112 are generated in response to the differential input signal, in accordance with well known operating principles.

The illustrated embodiment of the differential amplifier 100 includes an input stage 114, a first output stage 116, and a second output stage 118 (these stages are generally identified by the dashed lines in FIG. 1). In practice, any of these stages could include additional transistors or other circuit elements, and/or be defined in a different way than that depicted in FIG. 1. Moreover, although not shown in FIG. 1, a transistor or element of the differential amplifier 100 might be included in more than one of these stages.

The input stage 114 may include the first input node 106, the second input node 108, a plurality of n-type input transistors, and a plurality of p-type transistors. More specifically, the input stage 114 includes four p-type input transistors 201, 202, 203, 204 and four n-type input transistors 205, 206, 207, 208. In practice, all of the input transistors have nominally matched operating characteristics. In other words, ideally and theoretically all of the input transistors have the same $g_m$, this implies that all n-type input transistors have the same threshold voltage characteristics and are of the same size (e.g., channel length), and likewise for the p-type transistors, with a ratio between the n-type and p-type channel widths equal to the ratio between n-type and p-type mobility, and having the same channel length.

For the exemplary topology shown in FIG. 1, the p-type input transistor 201 is coupled to the p-type input transistor 202 to form one p-type differential input pair, the p-type input transistor 203 is coupled to the p-type input transistor 204 to form another p-type differential input pair, the n-type input transistor 205 is coupled to the n-type input transistor 206 to form one n-type differential input pair, and the n-type input transistor 207 is coupled to the n-type input transistor 208 to form another n-type differential input pair. Moreover, these differential pairs all receive the same differential input. In this regard, the gates of the p-type input transistor 204, the p-type input transistor 202, the n-type input transistor 208, and the n-type input transistor 206 are all coupled to (or correspond to) the first input node 106, while the gates of the p-type input transistor 203, the p-type input transistor 201, the n-type input transistor 207, and the n-type input transistor 205 are all coupled to (or correspond to) the second input node 108. The sources of the p-type input transistors 201, 202, 203, 204 are all coupled to (or correspond to) the first reference voltage node 102, while the sources of the n-type input transistors 205, 206, 207, 208 are all coupled to (or correspond to) the second reference voltage node 104.

The first output stage 116 is represented by the transistor stack that is formed by a p-type output transistor 224 and an n-type output transistor 216. The p-type output transistor 224 has its source coupled to (or corresponding to) the first reference voltage node 102, and the n-type output transistor 216 has its source coupled to (or corresponding to) the second reference voltage node 104. The drain of the p-type output transistor 224 is coupled to (or corresponds to) the first output node 110, and the drain of the n-type output transistor 216 is also coupled to (or corresponds to) the first output node 110. Thus, the first output node 110 is defined between the p-type output transistor 224 and the n-type output transistor 216. The second output stage 118 is represented by the transistor stack that is formed by a p-type output transistor 223 and an n-type output transistor 215. The p-type output transistor 223 has its source coupled to (or corresponding to) the first reference voltage node 102, and the n-type output transistor 215 has its source coupled to (or corresponding to) the second reference voltage node 104. The drain of the p-type output transistor 223 is coupled to (or corresponds to) the second output node 112, and the drain of the n-type output transistor 215 is also coupled to (or corresponds to) the second output node 112. Thus, the second output node 112 is defined between the p-type output transistor 223 and the n-type output transistor 215. In practice, all of the output transistors have nominally matched operating characteristics.

No matching between input and output transistors is required, although n-type input transistors are matched, p-type input transistors are matched, n-type output transistors are matched, and p-type output transistors are matched. Accordingly, in FIG. 1, the transistors 205, 206, 207, 208 are matched as a group, the transistors 201, 202, 203, 204 are matched as another group, the transistors 217, 218, 219, 220, 221, 222, 223, 224 are matched as yet another group, and the transistors 209, 210, 211, 212, 213, 214, 215, 216 are matched as another group.

Figure 2:
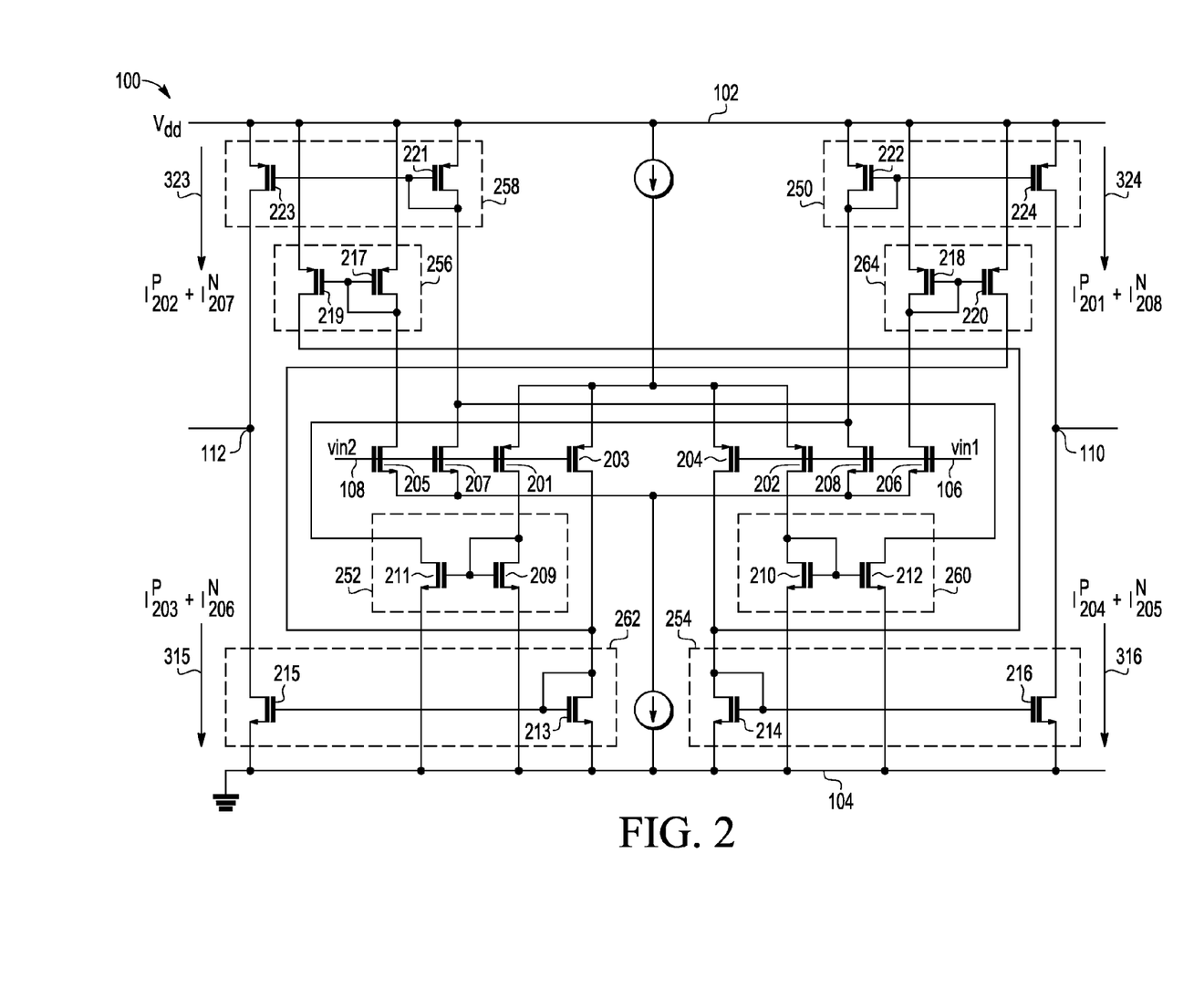
FIG. 2 is another circuit schematic of the differential amplifier shown in FIG. 1, highlighting certain features and aspects that are not depicted in FIG. 1.

This particular embodiment of the differential amplifier 100 employs a transistor-based current mirror architecture that serves to operatively couple the input stage 114 to the output stages 116, 118. FIG. 2 is another schematic diagram of the same differential amplifier 100; FIG. 2 depicts the current mirrors in the current mirror architecture. FIG. 2 is used here to avoid clutter on FIG. 1 and to improve the readability of the figures. The current mirror architecture includes a plurality of current mirrors, each of which is formed by two cooperating transistors. In particular, the current mirror architecture includes: a first current mirror 250 formed by the combination of a p-type mirror transistor 222 and the p-type output transistor 224; a second current mirror 252 formed by the combination of two n-type mirror transistors 211, 209; a third current mirror 254 formed by the combination of an n-type mirror transistor 214 and the n-type output transistor 216; a fourth current mirror 256 formed by the combination of two p-type mirror transistors 219, 217; a fifth current mirror 258 formed by the combination of a p-type mirror transistor 221 and the p-type output transistor 223; a sixth current mirror 260 formed by the combination of two n-type mirror transistors 210, 212; a seventh current mirror 262 formed by the combination of an n-type mirror transistor 213 and the n-type output transistor 215; and an eighth current mirror 264 formed by the combination of two p-type mirror transistors 218, 220.

Regarding the first current mirror 250, the p-type mirror transistor 222 has its source coupled to the first reference voltage node 102, its drain coupled to the drain of the n-type input transistor 208, and its gate coupled to the gate of the p-type output transistor 224. The gate and the drain of the p-type mirror transistor 222 are connected together to facilitate the current mirror functionality. The fifth current mirror 258 is similarly configured. In particular, the p-type mirror transistor 221 has its source coupled to the first reference voltage node 102, its drain coupled to the drain of the n-type input transistor 207, and its gate coupled to the gate of the p-type output transistor 223. Moreover, the gate and the drain of the p-type mirror transistor 221 are connected together to facilitate the current mirror functionality.

Regarding the second current mirror 252, the n-type mirror transistor 209 has its source coupled to the second reference voltage node 104, its drain coupled to the drain of the p-type input transistor 201, and its gate coupled to the gate of the n-type mirror transistor 211. The gate and the drain of the n-type mirror transistor 209 are coupled together to facilitate the current mirror functionality. The other n-type mirror transistor 211 has its source coupled to the second reference voltage node 104, and its drain coupled to the drain of the n-type input transistor 208. The sixth current mirror 260 is similarly configured. In this regard, the n-type mirror transistor 210 has its source coupled to the second reference voltage node 104, its drain coupled to the drain of the p-type input transistor 202, and its gate coupled to the gate of the n-type mirror transistor 212. The gate and the drain of the n-type mirror transistor 210 are coupled together to facilitate the current mirror functionality. The other n-type mirror transistor 212 has its source coupled to the second reference voltage node 104, and its drain coupled to the drain of the n-type input transistor 207.

Regarding the third current mirror 254, the n-type mirror transistor 214 has its source coupled to the second reference voltage node 104, its drain coupled to the drain of the p-type input transistor 204, and its gate coupled to the gate of the n-type output transistor 216. The gate and the drain of the n-type mirror transistor 214 are coupled together to facilitate the current mirror functionality. The seventh current mirror 262 is similarly configured. In particular, the n-type mirror transistor 213 has its source coupled to the second reference voltage node 104, its drain coupled to the drain of the p-type input transistor 203, and its gate coupled to the gate of the n-type output transistor 215. The gate and the drain of the n-type mirror transistor 213 are coupled together to facilitate the current mirror functionality.

Regarding the fourth current mirror 256, the p-type mirror transistor 217 has its source coupled to the first reference voltage node 102, its drain coupled to the drain of the n-type input transistor 205, and its gate coupled to the gate of the other p-type mirror transistor 219. The gate and drain of the p-type mirror transistor 217 are coupled together to facilitate the current mirror functionality. The other p-type mirror transistor 219 has its source coupled to the first reference voltage node 102, and its drain coupled to the drain of the p-type input transistor 204. The eighth current mirror 264 is similarly configured. In this regard, the p-type mirror transistor 218 has its source coupled to the first reference voltage node 102, its drain coupled to the drain of the n-type input transistor 206, and its gate coupled to the gate of the other p-type mirror transistor 220. The gate and drain of the p-type mirror transistor 218 are coupled together to facilitate the current mirror functionality. The other p-type mirror transistor 220 has its source coupled to the first reference voltage node 102, and its drain coupled to the drain of the p-type input transistor 203.

The first current mirror 250 and the second current mirror 252 are part of a first current mirror arrangement that is coupled to the p-type output transistor 224. Similarly, the third current mirror 254 and the fourth current mirror 256 are part of a second current mirror arrangement that is coupled to the n-type output transistor 216. Likewise, the fifth current mirror 258 and the sixth current mirror 260 are part of a third current mirror arrangement that is coupled to the p-type output transistor 223, and the seventh current mirror 262 and the eighth current mirror 264 are part of a fourth current mirror arrangement that is coupled to the n-type output transistor 215.

The first current mirror 250 is configured such that the current conducted by the p-type mirror transistor 222 is mirrored at the p-type output transistor 224. In other words, the current conducted by the p-type mirror transistor 222 will also be conducted by the p-type output transistor 224. Notably, the current conducted by the p-type mirror transistor 222 (and, therefore, the output current conducted by the p-type output transistor 224) includes contributions from different current sources or transistors. In particular, the output current conducted by the p-type output transistor 224 will include contributions from at least one of the n-type input transistors and from at least one of the p-type input transistors. More specifically, the current conducted by the n-type input transistor 208 and the current conducted by the p-type input transistor 201 will contribute to the output current conducted by the p-type output transistor 224. In this regard, the current conducted by the p-type input transistor 201 is mirrored by the second current mirror 252, which is coupled to the drain of the p-type mirror transistor 222. Thus, the first current mirror arrangement is suitably configured to mirror the current conducted by the p-type input transistor 201, combined with the current conducted by the n-type input transistor 208, at the p-type output transistor 224. This is accomplished using the depicted current mirror architecture, which has the second current mirror 252 coupled between the p-type input transistor 201 and the first current mirror 250.

The third current mirror 254 is similarly configured, such that the current conducted by the n-type mirror transistor 214 is mirrored at the n-type output transistor 216. Notably, the current conducted by the n-type mirror transistor 214 (and, therefore, the output current conducted by the n-type output transistor 216) includes contributions from the current conducted by the p-type input transistor 204 and the current conducted by the n-type input transistor 205. Note that the current conducted by the n-type input transistor 205 is mirrored by the fourth current mirror 256, which is coupled to the drain of the n-type mirror transistor 214. Thus, the second current mirror arrangement is suitably configured to mirror the current conducted by the n-type input transistor 205, combined with the current conducted by the p-type input transistor 204, at the n-type output transistor 216. This is accomplished using the depicted current mirror architecture, which has the fourth current mirror 256 coupled between the n-type input transistor 205 and the third current mirror 254.

The fifth current mirror 258 is configured such that the current conducted by the p-type mirror transistor 221 is mirrored at the p-type output transistor 223. The current conducted by the p-type mirror transistor 221 (and, therefore, the output current conducted by the p-type output transistor 223) includes contributions from the current conducted by the n-type input transistor 207 and the current conducted by the p-type input transistor 202. Note that the current conducted by the p-type input transistor 202 is mirrored by the sixth current mirror 260, which is coupled to the drain of the p-type mirror transistor 221. Thus, the third current mirror arrangement is suitably configured to mirror the current conducted by the p-type input transistor 202, combined with the current conducted by the n-type input transistor 207, at the p-type output transistor 223. This is accomplished using the depicted current mirror architecture, which has the sixth current mirror 260 coupled between the p-type input transistor 202 and the fifth current mirror 258.

The seventh current mirror 262 is configured such that the current conducted by the n-type mirror transistor 213 is mirrored at the n-type output transistor 215. The current conducted by the n-type mirror transistor 213 (and, therefore, the output current conducted by the n-type output transistor 215) includes contributions from the current conducted by the n-type input transistor 206 and the current conducted by the p-type input transistor 203. The current conducted by the n-type input transistor 206 is mirrored by the eighth current mirror 264, which is coupled to the drain of the n-type mirror transistor 213. Thus, the fourth current mirror arrangement is suitably configured to mirror the current conducted by the n-type input transistor 206, combined with the current conducted by the p-type input transistor 203, at the n-type output transistor 215. This is accomplished using the depicted current mirror architecture, which has the eighth current mirror 264 coupled between the n-type input transistor 206 and the seventh current mirror 262.

The differential amplifier 100 represents an exemplary OTA topology that exhibits process variation and transistor mismatch compensation as well as an input stage that supports a wide range of common mode voltage. The output stages also exhibit a wide range due to the use of (Vdd−Vss−2×Vds) as a voltage range. These characteristics make the topology suitable for various applications such as comparators and data recovery circuits (for memories, transmission lines, etc.). The topology is also suitable for low voltage applications because it uses a maximum of three transistors in stack.

As mentioned previously, the input stage comprises four differential pairs: two n-type pairs and two p-type pairs. Each differential pair has low impedance characteristics, and each differential pair mirrors current to the appropriate output stage, as explained above. The input stage may be considered to have three transistors in stack, such that the minimum voltage needed at the input (gates of differential pairs) is Vds+Vth for the n-type pairs, and such that the maximum voltage for the p-type pairs is Vdd−Vds−Vth. However, if voltage increases more than the maximum, then the n-type pairs will be saturated and will remain operational as long as the voltage at the drains of the n-type pairs does not exceed Vdd−Vth. If the input voltage decreases below the minimum, then the p-type pairs will still function as long as the voltage at the drains of the p-type pairs does not decrease by more than Vth.

Each output stage includes two transistors: one p-type transistor and one n-type transistor. Each transistor receives a reflection of current that is provided by an n-type input transistor and a p-type input transistor. In this regard, FIG. 2 is another circuit schematic of the differential amplifier 100 that depicts the different current contributions in the output branches. FIG. 2 depicts the respective output current conducted by each of the four output transistors 215, 216, 223, 224. The output current 315 is conducted by the n-type output transistor 215, the output current 316 is conducted by the n-type output transistor 216, the output current 323 is conducted by the p-type output transistor 223, and the output current 324 is conducted by the p-type output transistor 224. As indicated by the expressions in FIG. 2, each output current is based upon a sum of individual currents. This sum of currents is accomplished using the differential pairs (one n-type pair and one p-type pair), as described above. For this particular topology: the output current 315 is derived from the current of the p-type input transistor 203 and the current of the n-type input transistor 206; the output current 316 is derived from the current of the p-type input transistor 204 and the current of the n-type input transistor 205; the output current 323 is derived from the current of the p-type input transistor 202 and the current of the n-type input transistor 206; and the output current 324 is derived from the current of the p-type input transistor 201 and the current of the n-type input transistor 208. Note that the maximum output voltage is Vdd−Vds, and the minimum output voltage is Vds, to keep both transistors of an output stage in the saturation region.

Assuming that all transconductances of the input differential pairs are the same and that the charge transistors are reflecting the same current at the output (1:1), then the output voltage in the first output stage 116 is:

$$V_o = \frac{I_{224} - I_{216}}{gds_{216} + gds_{224}} \quad (1)$$

In (1), $I_{224}$ is the current of the p-type output transistor 224, $I_{216}$ is the current of the n-type output transistor 216, $gds_{216}$ is the small signal drain conductance of the transistor 216, and $gds_{224}$ is the small signal drain conductance of the transistor 224. The current $I_{224}$ and $I_{216}$ can be defined as:

$$I_{216} = (-Vin1)(gm_{204}) + Vin2(gm_{205}) \quad (2)$$

$$I_{224} = Vin1(gm_{208}) + (-Vin2)(gm_{201}) \quad (3)$$

In (2) and (3), gm is the transconductance of the input transistor identified by the subscript number. For example, $gm_{204}$ is the transconductance of the p-type input transistor 204. If Vin2=−Vin1 and if all transconductances are the same, then:

$$I_{216} = -2Vin1(gm) \quad (4)$$

$$I_{224} = 2Vin1(gm) \quad (5)$$

Using equations (1), (4), and (5), the gain can be obtained as follows:

$$V_o = \frac{2Vin1(gm) - [-2Vin1(gm)]}{gds_{216} + gds_{224}} \quad (6)$$

$$Av = \frac{4gm}{gds_{216} + gds_{224}} \quad (7)$$

In (7), the term Av represents the voltage gain at low frequency. Four transistors provide the transconductance that converts the differential input voltage into the currents going in a single output stage: two n-type transistors and two p-type transistors. This characteristic gives the circuit the ability to compensate for process and mismatch variations. The output resistance is the parallel of the resistance of the transistors on the output stage.

When using complementary pairs it is desirable to have the transconductance of the n-type pair be the same (or as close as possible) as the transconductance of the p-type pair. In practice, integrated circuit fabrication processes tend to unbalance or affect the nominal value of this parameter so that the transconductance of a p-type MOSFET will be different than the transconductance of a similarly sized n-type MOSFET. The differential amplifier 100 presented here helps to compensate for this form of deviation by using the eight components of current, which contribute to the output. These current contributions are provided by the differential pairs (four for a single output branch) in a balanced way that influences the output. In this regard, the following expression represents the output voltage in terms of current contribution of the differential pairs; this expression shows how the process compensation is realized in a practical embodiment.

$$V_O = \frac{-(I_{201} + I_{208}) + (I_{204} + I_{205})}{gds_{216} + gds_{224}} \quad (8)$$

In the above expression, $I_{201}$ is provided by the p-type input transistor 201, $I_{208}$ is provided by the n-type input transistor 208, $I_{204}$ is provided by the p-type input transistor 204, and $I_{205}$ is provided by the n-type input transistor 205. To represent the process deviation, an increment of current is added to the above expression ($\Delta I_N$ for n-type and $\Delta I_P$ for p-type), resulting in the following expression:

$$V_O = \frac{-(I_{201} + \Delta I_P + I_{208} + \Delta I_N) + (I_{204} + \Delta I_P + I_{205} + \Delta I_N)}{gds_{216} + gds_{224}} \quad (9)$$

As can be seen in (9), the increment of current caused by the n-type input transistor 208 will be canceled by the increment of current caused by the n-type input transistor 205 because they are the same magnitude but of opposite sign. The same effect occurs for the incremental current associated with the p-type input transistors 201, 204. Moreover, an equivalent analysis applies to the transistors 202, 203, 206, and 207.

The differential amplifier topology described above represents one exemplary embodiment of a fully differential rail-to-rail amplifier that is suitable for many practical applications. The differential amplifier topology achieves better overall performance (relative to conventional designs) with higher tolerance to process deviations. The rail-to-rail input/output voltage characteristics of the differential amplifier facilitates full range input voltage common mode, in contrast to typical designs that achieve only a limited range. Unlike previous fully differential rail-to-rail amplifier topologies, the topology presented here uses a balanced and symmetrical approach for its output transistors. In particular, each output transistor conducts current that includes contributions from both an n-type input transistor and a p-type input transistor. The complete symmetry in the presented topology reduces the effects of process variations and mismatches.

In summary, systems, devices, and methods configured in accordance with exemplary embodiments relate to:

A differential amplifier having a first reference voltage node, a second reference voltage node, and input stage, a first output stage, and a second output stage. The input stage includes a first input node for a first component of a differential input signal, a second input node for a second component of the differential input signal, a plurality of first conductivity type input transistors, and a plurality of second conductivity type input transistors, the first conductivity type input transistors having nominally matched operating characteristics and the second conductivity type input transistors having nominally matched operating characteristics. The first output stage includes a first second conductivity type output transistor having its source coupled to the first reference voltage node and having its drain coupled to a first output node for a first component of a differential output signal. The first output stage also includes a second first conductivity type output transistor having its drain coupled to the first output node and having its source coupled to the second reference voltage node. The second output stage includes a third second conductivity type output transistor having its source coupled to the first reference voltage node and having its drain coupled to a second output node for a second component of the differential output signal. The second output stage also includes a fourth first conductivity type output transistor having its drain coupled to the second output node and having its source coupled to the second reference voltage node. The first conductivity type output transistors have nominally matched operating characteristics, the second conductivity type output transistors have nominally matched operating characteristics, and each output transistor conducts a respective output current that includes contributions from at least one of the first conductivity type input transistors and at least one of the second conductivity type input transistors.

For the above differential amplifier, the input stage may include: a first second conductivity type input transistor having its gate corresponding to the second input node; a second second conductivity type input transistor having its gate corresponding to the first input node; a third second conductivity type input transistor having its gate corresponding to the second input node; a fourth second conductivity type input transistor having its gate corresponding to the first input node; a fifth first conductivity type input transistor having its gate corresponding to the second input node; a sixth first conductivity type input transistor having its gate corresponding to the first input node; a seventh first conductivity type input transistor having its gate corresponding to the second input node; and a eighth first conductivity type input transistor having its gate corresponding to the first input node. In accordance with an exemplary embodiment: the first second conductivity type input transistor is coupled to the second second conductivity type input transistor to form a first second conductivity type differential input pair; the third second conductivity type input transistor is coupled to the fourth second conductivity type input transistor to form a second second conductivity type differential input pair; the fifth first conductivity type input transistor is coupled to the sixth first conductivity type input transistor to form a first first conductivity type differential input pair; and the seventh first conductivity type input transistor is coupled to the eighth first conductivity type input transistor to form a second first conductivity type differential input pair. In accordance with an exemplary embodiment: current conducted by the first second conductivity type input transistor and current conducted by the eighth first conductivity type input transistor contribute to a first output current conducted by the first second conductivity type output transistor; current conducted by the fourth second conductivity type input transistor and current conducted by the fifth first conductivity type input transistor contribute to a second output current conducted by the second first conductivity type output transistor; current conducted by the second second conductivity type input transistor and current conducted by the seventh first conductivity type input transistor contribute to a third output current conducted by the third second conductivity type output transistor; and current conducted by the third second conductivity type input transistor and current conducted by the sixth first conductivity type input transistor contribute to a fourth output current conducted by the fourth first conductivity type output transistor. In accordance with an exemplary embodiment, the differential amplifier includes: a first current mirror arrangement coupled to the first second conductivity type output transistor, the first current mirror arrangement configured to mirror the current conducted by the first second conductivity type input transistor, combined with the current conducted by the eighth first conductivity type input transistor, at the first second conductivity type output transistor; a second current mirror arrangement coupled to the second first conductivity type output transistor, the second current mirror arrangement configured to mirror the current conducted by the fourth second conductivity type input transistor, combined with the current conducted by the fifth first conductivity type input transistor, at the second first conductivity type output transistor; a third current mirror arrangement coupled to the third second conductivity type output transistor, the third current mirror arrangement configured to mirror the current conducted by the second second conductivity type input transistor, combined with the current conducted by the seventh first conductivity type input transistor, at the third second conductivity type output transistor; and a fourth current mirror arrangement coupled to the fourth first conductivity type output transistor, the fourth current mirror arrangement configured to mirror the current conducted by the third second conductivity type input transistor, combined with the current conducted by the sixth first conductivity type input transistor, at the fourth first conductivity type output transistor.

For certain embodiments of the above differential amplifier, the first conductivity type input transistors and the second conductivity type input transistors have the same transconductance.

Systems, devices, and methods configured in accordance with exemplary embodiments also relate to:

A differential amplifier having an input stage, a first output stage, a second output stage, and a current mirror architecture. The input stage includes a plurality of differential pairs of input transistors having a first conductivity type and a plurality of differential pairs of input transistors having a second conductivity type, the input stage further comprising a first input node and a second input node for a differential input signal. The first output stage includes a first output transistor having the first conductivity type, and a second output transistor having the second conductivity type, the first output transistor and the second output transistor being stacked such that a first output node for a differential output signal is defined between the first output transistor and the second output transistor. The second output stage includes a third output transistor having the first conductivity type, and a fourth output transistor having the second conductivity type, the third output transistor and the fourth output transistor being stacked such that a second output node for the differential output signal is defined between the third output transistor and the fourth output transistor. The current mirror architecture is coupled to the input stage, the first output stage, and the second output stage, and the current mirror architecture is configured such that each of the first output transistor, the second output transistor, the third output transistor, and the fourth output transistor conducts a respective current that includes contributions from current conducting in one of the input transistors having the first conductivity type and from current conducting in one of the input transistors having the second conductivity type.

In certain embodiments, the input stage includes: a first differential pair including a first input transistor having the first conductivity type coupled to a second input transistor having the first conductivity type, the first input node corresponding to a gate of the second input transistor, and the second input node corresponding to a gate of the first input transistor; a second differential input pair including a third input transistor having the first conductivity type coupled to a fourth input transistor having the first conductivity type, the first input node corresponding to a gate of the fourth input transistor, and the second input node corresponding to a gate of the third input transistor; a third differential input pair including a fifth input transistor having the second conductivity type coupled to a sixth input transistor having the second conductivity type, the first input node corresponding to a gate of the sixth input transistor, and the second input node corresponding to a gate of the fifth input transistor; and a fourth differential input pair including a seventh input transistor having the second conductivity type coupled to an eighth input transistor having the second conductivity type, the first input node corresponding to a gate of the eighth input transistor, and the second input node corresponding to a gate of the seventh input transistor.

In certain embodiments: current conducted by the first input transistor and current conducted by the eighth input transistor contribute to a first output current conducted by the first output transistor; current conducted by the fourth input transistor and current conducted by the fifth input transistor contribute to a second output current conducted by the second output transistor; current conducted by the second input transistor and current conducted by the seventh input transistor contribute to a third output current conducted by the third output transistor; and current conducted by the third input transistor and current conducted by the sixth input transistor contribute to a fourth output current conducted by the fourth output transistor.

In some embodiments, the current mirror architecture includes: a first current mirror arrangement coupled to the first output transistor, the first current mirror arrangement configured to mirror the current conducted by the first input transistor, combined with the current conducted by the eighth input transistor, at the first output transistor; a second current mirror arrangement coupled to the second output transistor, the second current mirror arrangement configured to mirror the current conducted by the fourth input transistor, combined with the current conducted by the fifth input transistor, at the second output transistor; a third current mirror arrangement coupled to the third output transistor, the third current mirror arrangement configured to mirror the current conducted by the second input transistor, combined with the current conducted by the seventh input transistor, at the third output transistor; and a fourth current mirror arrangement coupled to the fourth output transistor, the fourth current mirror arrangement configured to mirror the current conducted by the third input transistor, combined with the current conducted by the sixth input transistor, at the fourth output transistor.

Systems, devices, and methods configured in accordance with exemplary embodiments may also relate to:

A differential amplifier having an input stage and a first output stage. The input stage includes two differential pairs of first conductivity type input transistors, and two differential pairs of second conductivity type input transistors. The first output stage includes a first second conductivity type output transistor and a second first conductivity type output transistor, the first second conductivity type output transistor having its source coupled to a first reference voltage node and having its drain coupled to a first output node for a first component of a differential output signal, and the second first conductivity type output transistor having its drain coupled to the first output node and having its source coupled to a second reference voltage node. A first second conductivity type input transistor and an eighth first conductivity type input transistor of the input stage influence operation of the first second conductivity type output transistor such that current conducted by the first second conductivity type input transistor and current conducted by the eighth first conductivity type input transistor contribute to a first output current conducted by the first second conductivity type output transistor. Moreover, a fourth second conductivity type input transistor and a fifth first conductivity type input transistor of the input stage influence operation of the second first conductivity type output transistor such that current conducted by the fourth second conductivity type input transistor and current conducted by the fifth first conductivity type input transistor contribute to a second output current conducted by the second first conductivity type output transistor.

In certain embodiments, the differential amplifier also includes a second output stage comprising a third second conductivity type output transistor and a fourth first conductivity type output transistor, the third second conductivity type output transistor having its source coupled to the first reference voltage node and having its drain coupled to a second output node for a second component of the differential output signal, and the fourth first conductivity type output transistor having its drain coupled to the second output node and having its source coupled to the second reference voltage node. A second second conductivity type input transistor and a seventh first conductivity type input transistor of the input stage influence operation of the third second conductivity type output transistor such that current conducted by the second second conductivity type input transistor and current conducted by the seventh first conductivity type input transistor contribute to a third output current conducted by the third second conductivity type output transistor. A third second conductivity type input transistor and a sixth first conductivity type input transistor of the input stage influence operation of the fourth first conductivity type output transistor such that current conducted by the third second conductivity type input transistor and current conducted by the sixth first conductivity type input transistor contribute to a fourth output current conducted by the fourth first conductivity type output transistor.

In certain embodiments: the first second conductivity type input transistor is coupled to the second second conductivity type input transistor to form a first second conductivity type differential pair; the third second conductivity type input transistor is coupled to the fourth second conductivity type input transistor to form a second second conductivity type differential pair; the fifth first conductivity type input transistor is coupled to the sixth first conductivity type input transistor to form a first first conductivity type differential pair; and the seventh first conductivity type input transistor is coupled to the eighth first conductivity type input transistor to form a second first conductivity type differential pair.

In some embodiments, the differential amplifier also includes: a first input node for a first component of a differential input signal; and a second input node for a second component of the differential input signal. The first second conductivity type input transistor has its gate coupled to the second input node, the eighth first conductivity type input transistor has its gate coupled to the first input node, the fourth second conductivity type input transistor has its gate coupled to the first input node, and the fifth first conductivity type input transistor has its gate coupled to the second input node.

In some embodiments: the first conductivity type input transistors have nominally matched operating characteristics; the second conductivity type input transistors have nominally matched operating characteristics; the first conductivity type output transistors have nominally matched operating characteristics; the second conductivity type output transistors have nominally matched operating characteristics; and the first conductivity type input transistors and the second conductivity type input transistors have the same transconductance.

In certain embodiments, the differential amplifier also includes a current mirror architecture coupled to the input stage and the first output stage, the current mirror architecture being configured such the first output current is influenced by the first second conductivity type input transistor and the eighth first conductivity type input transistor, and such that the second output current is influenced by the fourth second conductivity type input transistor and the fifth first conductivity type input transistor. In some embodiments, the current mirror architecture includes: a first current mirror arrangement coupled to the first second conductivity type output transistor, the first current mirror arrangement configured to mirror the current conducted by the first second conductivity type input transistor, combined with the current conducted by the eighth first conductivity type input transistor, at the first second conductivity type output transistor; and a second current mirror arrangement coupled to the second first conductivity type output transistor, the second current mirror arrangement configured to mirror the current conducted by the fourth second conductivity type input transistor, combined with the current conducted by the fifth first conductivity type input transistor, at the second first conductivity type output transistor. In some embodiments: the first current mirror arrangement comprises a first current mirror coupled to the eighth first conductivity type input transistor, and a second current mirror coupled between the first second conductivity type input transistor and the first current mirror; the first current mirror comprises the first second conductivity type output transistor; the second current mirror arrangement comprises a third current mirror coupled to the fourth second conductivity type input transistor, and a fourth current mirror coupled between the fifth first conductivity type input transistor and the third current mirror; and the fourth current mirror comprises the second first conductivity type output transistor. In certain embodiments: the first current mirror comprises a second conductivity type mirror transistor having its source coupled to the first reference voltage node, its drain coupled to the eighth first conductivity type input transistor, and its gate coupled to the first second conductivity type output transistor; and the fourth current mirror comprises an first conductivity type mirror transistor having its source coupled to the second reference voltage node, its drain coupled to the fourth second conductivity type input transistor, and its gate coupled to the second first conductivity type output transistor.

In some embodiments of the differential amplifier, the first reference voltage node corresponds to a supply voltage node, and the second reference voltage node corresponds to a ground voltage node.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A differential amplifier comprising:
  a first reference voltage node;
  a second reference voltage node;
  an input stage comprising a first input node for a first component of a differential input signal, a second input node for a second component of the differential input signal, a plurality of first conductivity type input transistors, and a plurality of second conductivity type input transistors, the first conductivity type input transistors having nominally matched operating characteristics and the second conductivity type input transistors having nominally matched operating characteristics;
  a first output stage comprising a first second conductivity type output transistor having its source coupled to the first reference voltage node and having its drain coupled to a first output node for a first component of a differential output signal, and comprising a second first conductivity type output transistor having its drain coupled to the first output node and having its source coupled to the second reference voltage node; and
  a second output stage comprising a third second conductivity type output transistor having its source coupled to the first reference voltage node and having its drain coupled to a second output node for a second component of the differential output signal, and comprising a fourth first conductivity type output transistor having its drain coupled to the second output node and having its source coupled to the second reference voltage node; wherein
  the first conductivity type output transistors have nominally matched operating characteristics;
  the second conductivity type output transistors have nominally matched operating characteristics; and
  each output transistor conducts a respective output current that includes contributions from at least one of the first conductivity type input transistors and at least one of the second conductivity type input transistors.

2. The differential amplifier of claim 1, wherein the input stage comprises:
- a first second conductivity type input transistor having its gate corresponding to the second input node;
- a second second conductivity type input transistor having its gate corresponding to the first input node;
- a third second conductivity type input transistor having its gate corresponding to the second input node;
- a fourth second conductivity type input transistor having its gate corresponding to the first input node;
- a fifth first conductivity type input transistor having its gate corresponding to the second input node;
- a sixth first conductivity type input transistor having its gate corresponding to the first input node;
- a seventh first conductivity type input transistor having its gate corresponding to the second input node; and
- a eighth first conductivity type input transistor having its gate corresponding to the first input node.

3. The differential amplifier of claim 2, wherein:
- the first second conductivity type input transistor is coupled to the second second conductivity type input transistor to form a first second conductivity type differential input pair;
- the third second conductivity type input transistor is coupled to the fourth second conductivity type input transistor to form a second second conductivity type differential input pair;
- the fifth first conductivity type input transistor is coupled to the sixth first conductivity type input transistor to form a first first conductivity type differential input pair; and
- the seventh first conductivity type input transistor is coupled to the eighth first conductivity type input transistor to form a second first conductivity type differential input pair.

4. The differential amplifier of claim 2, wherein:
- current conducted by the first second conductivity type input transistor and current conducted by the eighth first conductivity type input transistor contribute to a first output current conducted by the first second conductivity type output transistor;
- current conducted by the fourth second conductivity type input transistor and current conducted by the fifth first conductivity type input transistor contribute to a second output current conducted by the second first conductivity type output transistor;
- current conducted by the second second conductivity type input transistor and current conducted by the seventh first conductivity type input transistor contribute to a third output current conducted by the third second conductivity type output transistor; and
- current conducted by the third second conductivity type input transistor and current conducted by the sixth first conductivity type input transistor contribute to a fourth output current conducted by the fourth first conductivity type output transistor.

5. The differential amplifier of claim 4, further comprising:
- a first current mirror arrangement coupled to the first second conductivity type output transistor, the first current mirror arrangement configured to mirror the current conducted by the first second conductivity type input transistor, combined with the current conducted by the eighth first conductivity type input transistor, at the first second conductivity type output transistor;
- a second current mirror arrangement coupled to the second first conductivity type output transistor, the second current mirror arrangement configured to mirror the current conducted by the fourth second conductivity type input transistor, combined with the current conducted by the fifth first conductivity type input transistor, at the second first conductivity type output transistor;
- a third current mirror arrangement coupled to the third second conductivity type output transistor, the third current mirror arrangement configured to mirror the current conducted by the second second conductivity type input transistor, combined with the current conducted by the seventh first conductivity type input transistor, at the third second conductivity type output transistor; and
- a fourth current mirror arrangement coupled to the fourth first conductivity type output transistor, the fourth current mirror arrangement configured to mirror the current conducted by the third second conductivity type input transistor, combined with the current conducted by the sixth first conductivity type input transistor, at the fourth first conductivity type output transistor.

6. The differential amplifier of claim 1, wherein the first conductivity type input transistors and the second conductivity type input transistors have the same transconductance.

7. A differential amplifier comprising:
- an input stage comprising a plurality of differential pairs of input transistors having a first conductivity type and a plurality of differential pairs of input transistors having a second conductivity type, the input stage further comprising a first input node and a second input node for a differential input signal;
- a first output stage coupled to the input stage, the first output stage comprising a first output transistor having the first conductivity type, and a second output transistor having the second conductivity type, the first output transistor and the second output transistor being stacked such that a first output node for a differential output signal is defined between the first output transistor and the second output transistor;
- a second output stage coupled to the input stage, the second output stage comprising a third output transistor having the first conductivity type, and a fourth output transistor having the second conductivity type, the third output transistor and the fourth output transistor being stacked such that a second output node for the differential output signal is defined between the third output transistor and the fourth output transistor; and
- a current mirror architecture coupled to the input stage, the first output stage, and the second output stage, the current mirror architecture being configured such that each of the first output transistor, the second output transistor, the third output transistor, and the fourth output transistor conducts a respective current that includes contributions from current conducting in one of the input transistors having the first conductivity type and from current conducting in one of the input transistors having the second conductivity type.

8. The differential amplifier of claim 7, the input stage comprising:
- a first differential pair including a first input transistor having the first conductivity type coupled to a second input transistor having the first conductivity type, the first input node corresponding to a gate of the second input transistor, and the second input node corresponding to a gate of the first input transistor;
- a second differential input pair including a third input transistor having the first conductivity type coupled to a fourth input transistor having the first conductivity type, the first input node corresponding to a gate of the fourth input transistor, and the second input node corresponding to a gate of the third input transistor;

a third differential input pair including a fifth input transistor having the second conductivity type coupled to a sixth input transistor having the second conductivity type, the first input node corresponding to a gate of the sixth input transistor, and the second input node corresponding to a gate of the fifth input transistor; and a fourth differential input pair including a seventh input transistor having the second conductivity type coupled to an eighth input transistor having the second conductivity type, the first input node corresponding to a gate of the eighth input transistor, and the second input node corresponding to a gate of the seventh input transistor.

9. The differential amplifier of claim 8, wherein:

current conducted by the first input transistor and current conducted by the eighth input transistor contribute to a first output current conducted by the first output transistor;

current conducted by the fourth input transistor and current conducted by the fifth input transistor contribute to a second output current conducted by the second output transistor;

current conducted by the second input transistor and current conducted by the seventh input transistor contribute to a third output current conducted by the third output transistor; and current conducted by the third input transistor and current conducted by the sixth input transistor contribute to a fourth output current conducted by the fourth output transistor.

10. The differential amplifier of claim 8, the current mirror architecture comprising:

a first current mirror arrangement coupled to the first output transistor, the first current mirror arrangement configured to mirror the current conducted by the first input transistor, combined with the current conducted by the eighth input transistor, at the first output transistor;

a second current mirror arrangement coupled to the second output transistor, the second current mirror arrangement configured to mirror the current conducted by the fourth input transistor, combined with the current conducted by the fifth input transistor, at the second output transistor;

a third current mirror arrangement coupled to the third output transistor, the third current mirror arrangement configured to mirror the current conducted by the second input transistor, combined with the current conducted by the seventh input transistor, at the third output transistor; and a fourth current mirror arrangement coupled to the fourth output transistor, the fourth current mirror arrangement configured to mirror the current conducted by the third input transistor, combined with the current conducted by the sixth input transistor, at the fourth output transistor.

11. A differential amplifier comprising:

an input stage comprising two differential pairs of first conductivity type input transistors, and two differential pairs of second conductivity type input transistors; and a first output stage comprising a first second conductivity type output transistor and a second first conductivity type output transistor, the first second conductivity type output transistor having its source coupled to a first reference voltage node and having its drain coupled to a first output node for a first component of a differential output signal, and the second first conductivity type output transistor having its drain coupled to the first output node and having its source coupled to a second reference voltage node;

wherein a first second conductivity type input transistor and an eighth first conductivity type input transistor of the input stage influence operation of the first second conductivity type output transistor such that current conducted by the first second conductivity type input transistor and current conducted by the eighth first conductivity type input transistor contribute to a first output current conducted by the first second conductivity type output transistor; and wherein a fourth second conductivity type input transistor and a fifth first conductivity type input transistor of the input stage influence operation of the second first conductivity type output transistor such that current conducted by the fourth second conductivity type input transistor and current conducted by the fifth first conductivity type input transistor contribute to a second output current conducted by the second first conductivity type output transistor.

12. The differential amplifier of claim 11, further comprising a second output stage comprising a third second conductivity type output transistor and a fourth first conductivity type output transistor, the third second conductivity type output transistor having its source coupled to the first reference voltage node and having its drain coupled to a second output node for a second component of the differential output signal, and the fourth first conductivity type output transistor having its drain coupled to the second output node and having its source coupled to the second reference voltage node;

wherein a second second conductivity type input transistor and a seventh first conductivity type input transistor of the input stage influence operation of the third second conductivity type output transistor such that current conducted by the second second conductivity type input transistor and current conducted by the seventh first conductivity type input transistor contribute to a third output current conducted by the third second conductivity type output transistor; and wherein a third second conductivity type input transistor and a sixth first conductivity type input transistor of the input stage influence operation of the fourth first conductivity type output transistor such that current conducted by the third second conductivity type input transistor and current conducted by the sixth first conductivity type input transistor contribute to a fourth output current conducted by the fourth first conductivity type output transistor.

13. The differential amplifier of claim 12, wherein:

the first second conductivity type input transistor is coupled to the second second conductivity type input transistor to form a first second conductivity type differential pair;

the third second conductivity type input transistor is coupled to the fourth second conductivity type input transistor to form a second second conductivity type differential pair;

the fifth first conductivity type input transistor is coupled to the sixth first conductivity type input transistor to form a first first conductivity type differential pair; and the seventh first conductivity type input transistor is coupled to the eighth first conductivity type input transistor to form a second first conductivity type differential pair.

14. The differential amplifier of claim 11, further comprising:

a first input node for a first component of a differential input signal; and a second input node for a second component of the differential input signal; wherein:

the first second conductivity type input transistor has its gate coupled to the second input node;

the eighth first conductivity type input transistor has its gate coupled to the first input node;

the fourth second conductivity type input transistor has its gate coupled to the first input node; and the fifth first conductivity type input transistor has its gate coupled to the second input node.

15. The differential amplifier of claim 11, wherein:

the first conductivity type input transistors have nominally matched operating characteristics;

the second conductivity type input transistors have nominally matched operating characteristics;

the first conductivity type output transistors have nominally matched operating characteristics;

the second conductivity type output transistors have nominally matched operating characteristics; and the first conductivity type input transistors and the second conductivity type input transistors have the same transconductance.

16. The differential amplifier of claim 11, further comprising a current mirror architecture coupled to the input stage and the first output stage, the current mirror architecture being configured such the first output current is influenced by the first second conductivity type input transistor and the eighth first conductivity type input transistor, and such that the second output current is influenced by the fourth second conductivity type input transistor and the fifth first conductivity type input transistor.

17. The differential amplifier of claim 16, the current mirror architecture comprising:

a first current mirror arrangement coupled to the first second conductivity type output transistor, the first current mirror arrangement configured to mirror the current conducted by the first second conductivity type input transistor, combined with the current conducted by the eighth first conductivity type input transistor, at the first second conductivity type output transistor; and a second current mirror arrangement coupled to the second first conductivity type output transistor, the second current mirror arrangement configured to mirror the current conducted by the fourth second conductivity type input transistor, combined with the current conducted by the fifth first conductivity type input transistor, at the second first conductivity type output transistor.

18. The differential amplifier of claim 17, wherein:

the first current mirror arrangement comprises a first current mirror coupled to the eighth first conductivity type input transistor, and a second current mirror coupled between the first second conductivity type input transistor and the first current mirror;

the first current mirror comprises the first second conductivity type output transistor;

the second current mirror arrangement comprises a third current mirror coupled to the fourth second conductivity type input transistor, and a fourth current mirror coupled between the fifth first conductivity type input transistor and the third current mirror; and the fourth current mirror comprises the second first conductivity type output transistor.

19. The differential amplifier of claim 18, wherein:

the first current mirror comprises a second conductivity type mirror transistor having its source coupled to the first reference voltage node, its drain coupled to the eighth first conductivity type input transistor, and its gate coupled to the first second conductivity type output transistor; and the fourth current mirror comprises an first conductivity type mirror transistor having its source coupled to the second reference voltage node, its drain coupled to the fourth second conductivity type input transistor, and its gate coupled to the second first conductivity type output transistor.

20. The differential amplifier of claim 11, wherein:

the first reference voltage node corresponds to a supply voltage node; and the second reference voltage node corresponds to a ground voltage node.

* * * * *